United States Patent
Heath et al.

(10) Patent No.: US 6,198,655 B1
(45) Date of Patent: Mar. 6, 2001

(54) ELECTRICALLY ADDRESSABLE VOLATILE NON-VOLATILE MOLECULAR-BASED SWITCHING DEVICES

(75) Inventors: James Richard Heath, Santa Monica; Charles Patrick Collier, Los Angeles, both of CA (US); Gunter Mattersteig, Battaune bei Eilenburg (DE); Francisco M. Raymo, Los Angeles, CA (US); James Fraser Stoddart, Santa Monica, CA (US); Eric Wong, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/459,246

(22) Filed: Dec. 10, 1999

(51) Int. Cl.$^7$ ..................................................... G11C 13/00
(52) U.S. Cl. ............................................................. 365/151
(58) Field of Search ...................................... 365/151, 153

(56) References Cited

U.S. PATENT DOCUMENTS 5,444,651 * 8/1995 Yamamoto et al. ................. 365/108
6,031,756 * 2/2000 Gimzewski et al. ................. 365/151

* cited by examiner

*Primary Examiner*—David Nelms
*Assistant Examiner*—Thong Le
(74) *Attorney, Agent, or Firm*—Oppenheimer Wolff & Donnelly LLP

(57) ABSTRACT

Volatile and non-volatile solid state molecular switching devices which are electrically addressable and may be used in memory cells, routing circuits, inverters and field programmable devices which may or may not be designed to exhibit diode behavior. The molecular switching devices include certain [2] catenanes as bistable molecules which are sandwiched between two switch terminals. The switches are extremely small and have dimensions which range from several microns down to a few nanometers.

18 Claims, 6 Drawing Sheets

ELECTRICALLY ADDRESSABLE VOLATILE NON-VOLATILE MOLECULAR-BASED SWITCHING DEVICES

This invention was made with Government support under Contract No. DABT63-99-3-0003, awarded by the U.S. Army. The Government has certain rights in this invention.

BACKGROUND OF THE INVENTION

1. Field of the Invention

The present invention relates generally to electronic devices designed for memory or data storage. It also is related generally to electronic devices designed for the switching and routing of electrical signals. The invention also relates generally to electronic devices whose critical dimensions are measured in nanometers, and, more particularly, to simple devices used as building blocks to form more complicated structures, and to the methods for forming such devices.

2. Field of the Invention

Random access memory (RAM) is becoming an increasingly important component of electronic hardware, with applications ranging from 'smart credit cards' to computer storage, to name just two. Dynamic random access memory (DRAM) is based on silicon fabrication technology, and is a volatile memory characterized by a destructive read. This means that it is necessary to supply voltage to the memory bits at all times, or the information will disappear, Furthermore, each memory element has associated with it a transistor. This means that such memory devices will never be manufactured at a density that is greater than that allowable by the current generation of lithographic technology. Finally, reading the state of a DRAM bit will destroy the information in that bit.

More recently, a device called ferromagnetic RAM, or Fe-RAM, has been developed by a number of companies. A Fe-RAM device is a non-volatile memory bit which may be incorporated into something known as a cross-point memory array (see U.S. Pat. No. 5,640,343). The advantage of such an array is that the individual Fe-RAM devices do not require a transistor for every memory bit, but instead require on the order of $n^{1/2}$ transistors for n memory bits. Fe-RAM is, however, characterized by a destructive read, similar to DRAM. Fe-RAM devices are based on the principle of using an electric field to change the magnetic moment of a ferromagnet. For certain materials, when this magnetic moment is changed, there is also a small change in the electrical resistance of the ferromagnetic material. For very small domains, this switching behavior no longer works, as ferromagnetic materials do not retain their ferromagnetic character when the size of the material becomes very small (i.e., less than 30 nanometers). Finally, the difference between a '1' and a '0' state in a Fe-RAM memory element is about a 15% change in resistance. This means that only relatively small cross-point memory arrays (less than 1 megabyte) of Fe-RAM can be constructed. It also means that FeRAM devices can only function as memory bits. They cannot function as true switches.

There recently has been developed electronic devices which are made up of two crossed wires between which is sandwiched an electrically addressable molecular species. These devices are simple and inexpensive to make. The devices can also be made to be extremely small with dimensions on the order of several microns down to a few nanometers. These devices can be used to produce crossbar switch arrays, logic devices, memory devices and communication and signal routing devices. Crossed wire or crossbar devices are disclosed in the following published patent applications:

U.S. patent application Ser. No. 09/292,767 entitled "Chemically Synthesized and Assembled Electronic Devices" [PD-10981971-1];

U.S. patent application Ser. No. 09/280,225 entitled "Molecular Wire Crossbar Interconnects for Signal Routing and Communications" [PD-10981966-1];

U.S. patent application Ser. No. 09/282,045 entitled "Molecular Wire Crossbar Logic" [PD-10981969-1];

U.S. patent application Ser. No. 09/282049 entitled "Demultiplexer for a Molecular Wire Crossbar Network" [PD-10981970-1]; and

SUMMARY OF THE INVENTION

In accordance with the present invention, it was discovered that certain [2] catenanes can be used to form thin films which are especially well suited for use in making solid state molecular crossbar switching devices. The switching devices based on the [2] catenanes can be volatile or non-volatile and are characterized by a non-destructive read. They exhibit a large resistance difference between a '0' and a '1' state and are not based on a bulk physical phenomena that disappears at very small length scales. The devices employing [2] catenanes as the bistable electrically addressable molecule which is sandwiched between crossed wires can be used as memory bits or as switches which continue to operate even for very small dimensions. Such devices include all of the various types of devices described in the above-referenced PCT publications.

The present invention is directed to solid state molecular switching devices that include crossed wires which form first and second terminals between which is sandwiched a [2] catenane molecule. The switching devices may be used in memory cells, routing circuits, inverters or field programmable devices which may or may not exhibit diode behavior. The invention also involves methods for making the devices which include forming a monolayer of [2] catenane molecules using counter ions in the film forming mixture.

The above described and many other features and attendant advantages of the present invention will become better understood by reference to the following detailed description when taken in conjunction with the accompanying drawings.

DETAILED DESCRIPTION OF THE INVENTION

Definitions

Figure 1:
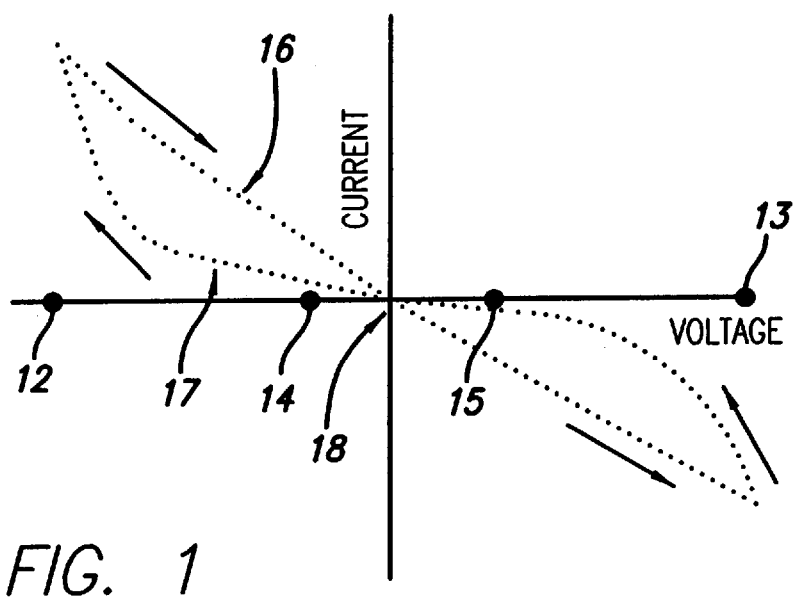
FIG. 1 is a current vs. voltage diagram showing the hysteresis loop for a non-volatile switch.

Mol-RAM as used herein refers to molecular-switch based array of memory cells.

A memory bit as used herein refers to a physical device that can exist in two states ('0' or '1') that can be distinguished from one another by electrically probing the device.

A switch as used herein refers to a physical device that can switch between two states, such as 'open' and 'closed,' and the difference between the two states can be probed electronically. The difference between the two states of a switch is typically greater than for a memory bit. For example, if the electrical property that is measured to determine the state of the switch is resistance of the device, then a memory bit may be characterized by a 20% change in resistance, while a switch may be characterized by a 200% change in resistance. A switch can be used as a memory bit, but a memory bit may not necessarily be useful as a switch.

Self-assembled as used herein refers to a system that naturally adopts some geometric pattern because of the identity of the components of the system; the system achieves at least a local minimum in its energy by adopting this configuration.

Singly configurable as used herein means that a switch can change its state only once via an irreversible process such as an oxidation or reduction reaction; such a switch can be the basis of a programmable read only memory (PROM), for example.

Reconfigurable as used herein means that a switch can change its state multiple times via a reversible process such as an oxidation or reduction; in other words the switch can be opened and closed multiple times such at the memory bits in a random access memory (RAM).

Redox active as used herein means that a molecule or molecular junction can be electrochemically reduced or oxidized, meaning that electrical charge can be added or taken away from the molecules or molecular junction.

Micron-scale dimensions as used herein refers to dimensions that range from 1 micrometer to a few micrometers in size.

Sub-micron scale dimensions as used herein refers to dimensions that range from 1 micrometer down to 0.04 micrometers.

Nanometer scale dimensions as used herein refers to dimensions that range from 0.1 nanometers to 50 nanometers (0.05 micrometers).

Micron-scale and submicron-scale wires as used herein refers to rod or ribbon-shaped conductors of semiconductors with widths or diameters having the dimensions of 1 to 10 micrometers, heights that can range from a few tens of nanometers to a micrometer, and lengths of several micrometers and longer.

[2] Catenanes as used herein refer to molecular compounds consisting of two or more interlocking rings, each of which may be prepared as a separate and distinct molecule. Catenanes may be electrically charged (meaning that they are molecular ions), in which case they are often associated with a counterion of opposite charge.

A preferred [2] catenane is $[C_{70}H_{76}N_4O_{10}S_4]^{4+}$. Methods for making [2] catenane are known. For example, see M. Asakawa, P. R. Ashton, V. Balzani, A. Credi, C. Hamers, G. Mattersteig, M. Montalti, A. N. Shipway, N. Spencer, J. F. Stoddart, M. S. Tolley, M. Venturi, A. J. P. White, and D. J. Williams, "A chemically and electrochemically switchable [2] Catenane incorporating a tetrathiafulvalene unit," *Angewandte Chemie International Edition in English*, vol. 37, p. 333 (1998).

Hysteresis as used herein refers to the character of a current-voltage measurement such that the forward voltage trace (negative to positive voltage) is characterized by a different current flow than the reverse voltage trace (positive to negative voltage). $V_{LH}$ refers to the low voltage end of the hysteresis loop, and $V_{HH}$ refers to the high voltage end of the current loop. $V_{MH}$ is some a voltage value somewhere between $V_{LH}$ and $V_{HH}$.

Volatile as used herein refers to a memory cell that loses the stored information unless an electric potential is applied to it.

Non-volatile as used herein refers to a memory cell that maintains the stored information in the absence of an applied electric potential.

Non-destructive read as used herein refers to the operation of a memory cell such that the information in the cell can be read out without affecting the status of the memory bit.

A molecular-switch based array of memory cells (Mol-RAM) is an array of electrically addressable molecular switches, each of which can store a '1' or a '0', or similarly, can be in the 'switch-closed' or 'switch-open' states. Each memory cell is a tunnel junction (TJ) element that consists of two conducting wires, in between which is sandwiched a thin layer of molecules. Diode behavior is built into the device via the use of various electrode materials to make a variation of the common metal[1]-insulator-metal[2] ($M^1IM^2$) diode, where $M^1$ and $M^2$ are different metals, or a metal-insulator-semiconductor (MIS) diode.

For the above devices, the insulator includes the molecular layer, and the nature of the insulating layer depends on the electronic properties of the molecule. The thin molecular layer (a single monolayer, for example) consists of redox active [2] catenane molecules, which are charged, and their corresponding counter-ions. Each memory cell in the array is controlled by only two wires. The operation of the device is based on the reversible oxidation or reduction of the molecular junction. For certain very special types of molecular junctions, if a variable voltage is applied across the junction, and the response of the junction is probed by measuring the current or resistance of the junction, then a hysteresis loop can be measured.

The operation of a device utilizing a hysteresis loop as the basis for a reconfigurable switch, or a memory element, is shown in FIG. 1. When a variable voltage is applied across the device from low voltage (12) to high voltage (13), current is observed to follow one voltage dependent path (16). However, when voltage is scanned from high voltage

(13) to low voltage (12), current is observed to take a different voltage-dependent path (17). Thus, if a voltage that is in between two values (14 and 15) is applied to the device, then the measured current is dependent on the previous history of the device. For the curve in FIG. 1, a high current state (a '1' or 'switch-closed' state) can be written into the device by applying some low voltage (12), and then reading the device at some intermediate voltage (between 14 and 15). A low current state (a '0' or 'switch-open' state) can be written into the device by applying the device at some high voltage (13) and that state can again be read at some intermediate voltage (14 to 15). If the hysteresis loop crosses through the 0-Volts, 0-current point (18), then the switch is considered to be 'non-volatile'. If probing the state of the device at some voltage within the range (14) to (15) does not change the state of the device, then this step is considered to be a 'non-destructive' read.

Figure 2:
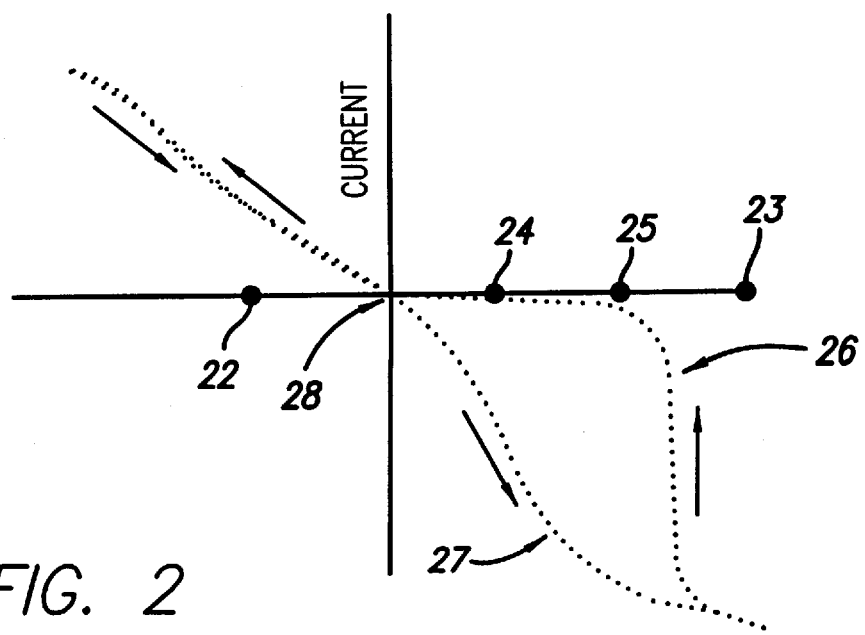
FIG. 2 is a current vs. voltage diagram showing the hysteresis loop for a volatile switch.

A second type of hysteresis loop that is also useful for memory storage or for a reconfigurable switch is shown in FIG. 2. In this case, the current voltage trace hysteresis loop is offset from the 0-Volts, 0-Current point (28), and the hysteresis loop (27,26) is centered about a non-zero voltage. However, the operation of the device is similar. The device is written by applying either a low (22) or a high (23) voltage. Similar to the previous case, the device is considered to be in the '1,' or 'closed' state if the resistance of the device is low, or if the magnitude of current flow through the device is high. Conversely, the device is considered to be in a '0' or 'open' state if the resistance of the device is high, or the magnitude of current flow through the device is low. If the state of the device is read by monitoring the current at a voltage within the range (24 to 25), then that state will depend on the history of the device in the following way: If the device was previously written at a low voltage (22), a 'high' state will be read at some intermediate voltage (24 to 25). If the device is written at a voltage to the high voltage side of the hysteresis loop (23), then a 'low' state is read at some intermediate voltage (24 to 25).

Variations on FIGS. 1 and 2 in which the hysteresis loop (16, 17, 26, 27) appears similar but the function of the forward and reverse voltage scans is the opposite of FIGS. 1 and 2 are possible. Variations of FIG. 2 in which the hysteresis loop (26,27) appears at negative voltages are also possible.

A device which exhibits a hysteresis loop such as that shown in FIG. 2 may be made non-volatile by adjusting the electrode materials so that the chemical potential between the two electrodes (the difference in Fermi energies) is equal to some value within the voltage range of the 'read' step (24 to 25).

An object of the invention is to generate a hysteretic current-voltage curve in a thin, solid-state, electrochemical cell consisting of redox-active molecules. Most molecules that are redox active will not exhibit a hysteretic current voltage curve, and thus the hysteresis has to be 'built in' to the molecule. One approach is to synthesize a bistable molecule in which both states are accessible via oxidation/reduction processes, and in which the states are separated by an energy barrier. It is this energy barrier that ultimately lends hysteresis to the current-voltage curve. If a molecule undergoes a substantial reorganization once it is oxidized or reduced, then that reorganization process requires energy, and can provide the basis for the energy barrier. Furthermore, the device fabrication process must allow for direct electrical access to the molecule or molecules. Finally, the design of the molecule shape and/or the device fabrication process must allow for sufficient free volume within the device so that the molecule can re-organize once it has been oxidized or reduced.

Figure 3:
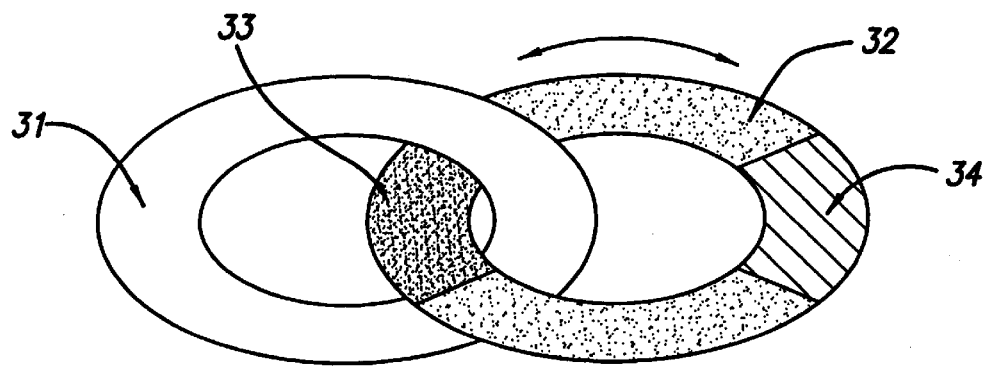
FIG. 3 is a simplified diagrammatic representation of the molecular switching mechanism of the [2] catenane molecules which are used in devices in accordance with the present invention.

In accordance with the present invention, the above object is achieved by using a class of molecules known as [2] catenanes. A schematic of how a [2] catenane can be used as a switch is shown in FIG. 3, which is meant to symbolize a [2] catenane. Catenanes having more than two rings may be used, if desired. However, the use of [2] catenanes is preferred. Such a [2] catenane has a molecular structure that consists of two interlocking rings (31,32). One of the rings (32) has two chemical sites (33,34), each one of which can bind to the other ring (31), and so the catenane is bistable. However, the issue of which of those binding sites (33,34) actually does bind to the ring (31) may be determined by oxidation/reduction processes. For example, the molecule, as prepared, is oriented so that site (33) on ring (32) has a strong binding affinity for ring (31). Therefore, the two rings (31,33) will be arranged to maximize this interaction, as shown in FIG. 3. If an electron is removed from site (33) on ring (32), then the binding preference can change, so that now the lowest energy configuration has site (34) inside ring (31). One of the two rings (31,32) must rotate in order to accommodate this new configuration. This reorganization is, on a molecular scale, relatively large, and it can provide the basis for an energy barrier that separates the two geometries.

Figure 4A:
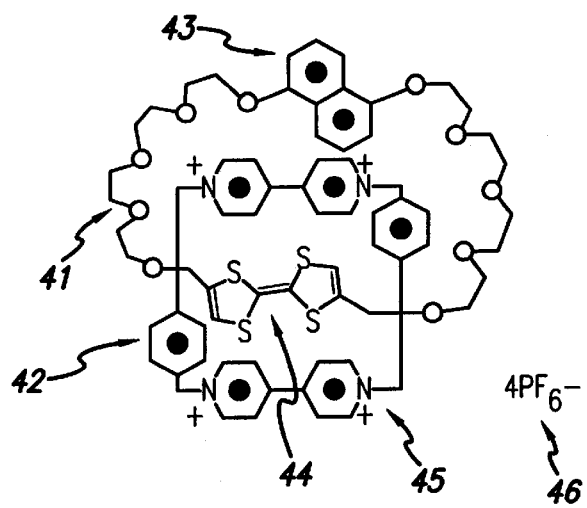
FIG. 4A shows the structure of a preferred exemplary [b 2] catenane.

A preferred exemplary [2] catenane structure is shown in FIG. 4A. The chemical formula for this molecular ion is $[C_{70}H_{76}N_4O_{10}S_4]^{4+}$. The molecule is typically prepared as a salt, with typical counterions such as $PF_6^-$. In that case, the chemical formula for the molecular compound is $C_{70}H_{76}F_{24}N_4O_{10}P_4S_4$. This system consists of one ring (42) containing two bipyridinium units (45), and a second crown-ether ring (41) that has biphenyl (43) and tetrathiolfulvalene (TTF) (44) components on opposite sides of the ring. These two components (43, 44) are the two binding sites of ring (41), and they can bind to the bipyridinium units (45) on the ring (42). Ring (42) is positively charged, and, in this case, charge neutrality of the entire complex is supplied by the counterions, which are four hexafluorophosphine anions $(PF_6-)(46)$.

Figure 4B:
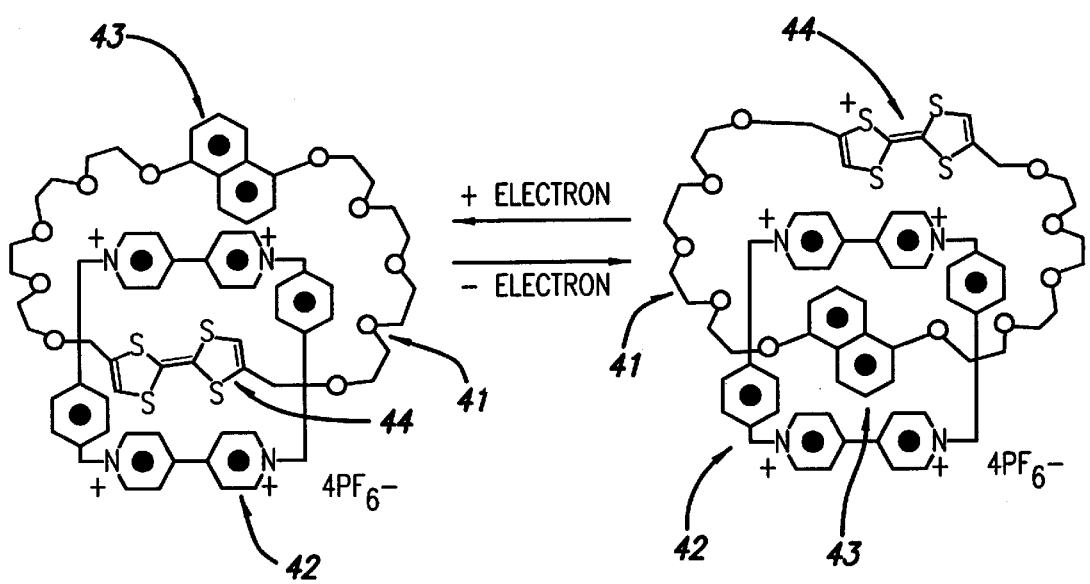
FIG. 4B depicts on a molecular level the switching mechanism for the [2] catenane.

The switching action of this molecule is shown in FIG. 4B. When this molecule is oxidized, the TTF-site (44) on ring (41) becomes positively charged. The result is that it is now repelled by the positively charged ring (42), and one of the rings (41,42) rotates so that now the biphenyl site (43) of ring (41) is inside ring (42). This ring motion provides an energy barrier to the redox chemistry. That barrier, coupled with the bistability of the catenane, provides for hysteresis in the current voltage characteristics of devices that incorporates these molecular compounds. This switching motion has been previously demonstrated in the solution phase, but not in a solid state device. (A. Masumi et al., "A Chemically and Electrochemically Switchable [2] Catenane Incorporating a Tetrathiafulvalene Unit," *Agnew Chem. Int Ed.* 1998, 37, No. 3, pp. 333–337; V. Balzani et al., "The Switching of Pseudorotaxanes and Catenanes Incorporating a Tetrathiafulvalene Unit by Redox and Chemical Inputs," *Journal of Organic Chemistry* (in press).)

Figure 5A:
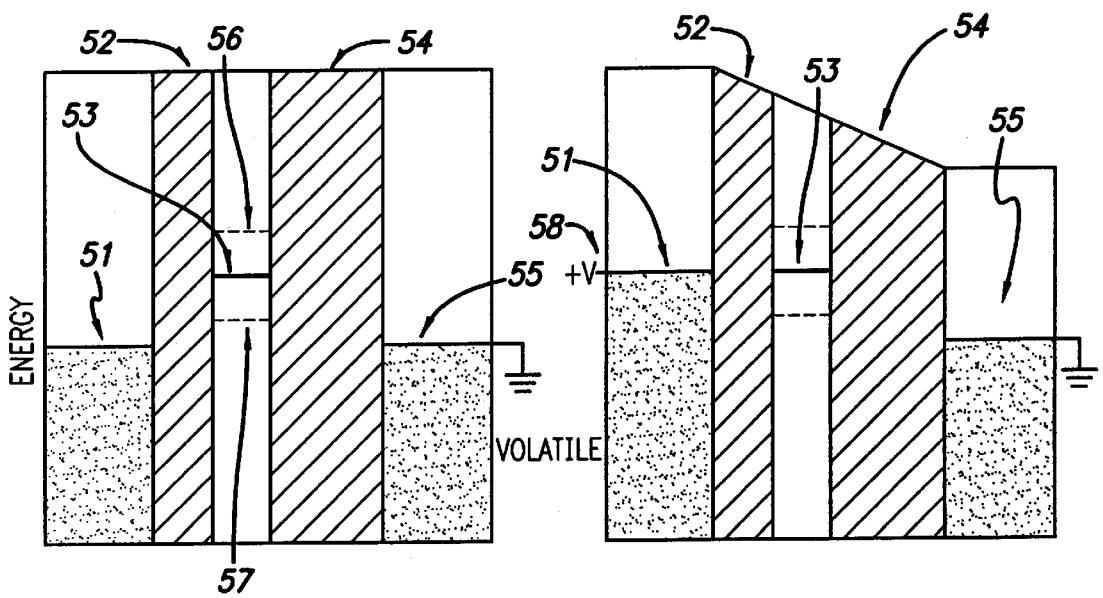
FIG. 5A is an energy level diagram of a volatile molecular switch.
Figure 5B:
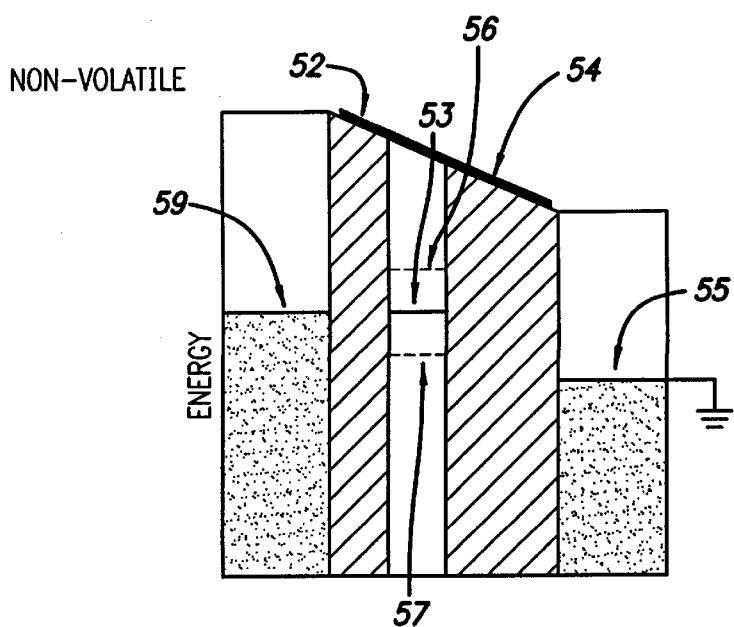
FIG. 5B is an energy level diagram of a non-volatile molecular switch.

The ability of the molecular switching device to provide volatile or non-volatile memory is dependent upon the nature of the electrodes. FIG. 5 (A) is a schematic of the energy level diagram of a volatile molecular switch, while FIG. 5 (B) is the energy level diagram of a non-volatile molecular switch in which the switching mechanism is based upon the oxidation of the molecule. For the volatile device (FIG. 5A), the energy level of the oxidized molecule (53) will be at the central voltage of the hysteresis loop— i.e., it will be the voltage at which the state of the switch is read. The width of the hysteresis loop will be determined by (56,57), which are related to the activation energy required to get the molecule to re-organize. The energy level of the oxidized molecule (53) is separated from occupied electronic states of the two electrodes (51, 55) by energy (tunneling) barriers (52, 54) on either side of the molecule.

The entire energy range of the hysteresis loop (56,57) is at a higher energy than the electronic states of either electrode (51,55), so that the hysteresis loop of the device will be centered at some positive voltage. The hysteresis loop is therefore accessed by applying a positive voltage voltage bias (58) to electrode (51). If that voltage is removed, then the energy level of the electrode (51) falls below the bottom of the hysteresis loop (57) and the state of the switch is lost. Only by holding electrode (51) at voltage (58) is it possible to hold the switch in place. Therefore, the state of the memory 'evaporates' when the bias (58) is removed.

The energy level for a non-volatile molecular switch is shown in FIG. 5 (B). In this case, the energy levels of the two electrodes (59,55) are not the same, as electrode (59) is now made of a different material. The result is that a static electric field is imposed upon the region between the two electrodes (59,55), and the hysteresis loop (56,57) is now symmetric about the energy of electrode (59). Thus, positive voltages are used to access the high energy side of the hysteresis loop (56), and negative voltages are used to access the low-energy side of the hysteresis loop (57). When no field at all is applied, then the state of the memory bit is unchanged, and does not 'evaporate.'

Solid-state, bistable switches were prepared by incorporating the [2] catenane shown in FIG. 4A into a two-terminal device arranged in a sandwich configuration. Thin films of the 121 catenane were prepared as Langmuir monolayers on a water surface, and transferred as Langmuir Blodgett films. In order to prepare the [2] catenanes as Langmuir monolayers, it was necessary to make these molecular compounds amphiphilic. Amphiphiles will form a molecular monolayer at an air/water interface. In order to make the [2] catenanes amphiphilic, the hexafluorophosphine anions (46) were replaced with the hydrocarbon shown in FIG. 6. Such substituted catenanes have been previously demonstrated to make high quality Langmuir-Blodgett films. (C. L. Brown et al., "The Introduction of [2] Catenanes into Langmuir Films and Langmuir-Blodgett Multilayers—A Possible Strategy for Molecular Information Storage Materials," Langmuir (in press).)

Figure 6:
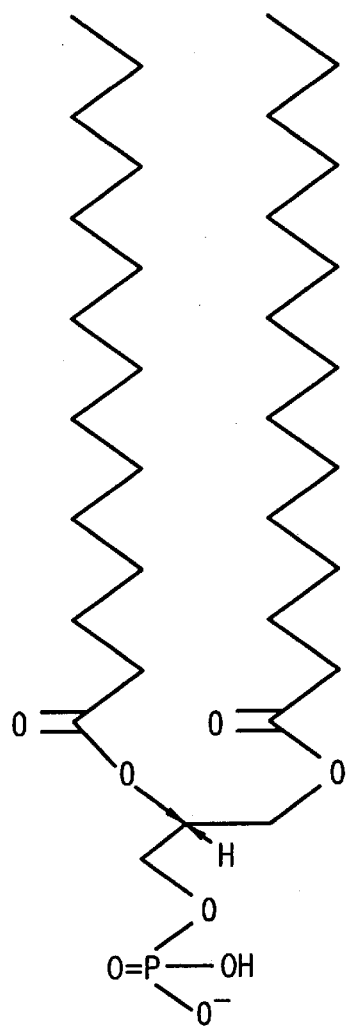
FIG. 6 shows a preferred exemplary counter ion that is used in making films which are used in preparing devices in accordance with the present invention.

The counter ion shown in FIG. 6 is a preferred counter ion. The counterions that are suitable here must meet two requirements. First, they must balance the charge of the [2]catenane, so that a charge-neutral film may be prepared. Second, they must be amphiphilic, so that a Langmuir monolayer of the catenane/couterion complex may be formed. Specific examples of alternative counterions include, but are not limited to, amphiphilic carboxylate anions, such as the anion of eicosanoic acid ($CH_3(CH_2)_{18}CO_2^-$), amphiphilic sulfate anions, such as ($CH_3(CH_2)_{n=8-20}SO_3^-$), other amphiphilic phospholipid anions similar to the one used here. The various amounts of catenane and counter ion which are used in the film forming solution, as well as the carrier solution itself, can be varied in order to achieve the desired formation of a monolayer of catenane molecules.

The formation of Langmuir monolayers of amphiphilic molecules is a well known art. See for example, the review (Knobler, C M; Schwartz, D K. "Langmuir and self-assembled monolayers," *Current Opinion In Colloid & Interface Science,* vol. 4, p. 46–51, (1999)). Preparing Langmuir monolayer of ionic molecular compounds can often involve additional complexities. For example, in an ionic compound, often either the cation or the anion has some characteristic water solubility, and it is not possible to form Langmuir monolayers from water soluble complexes. Typically what is done is to specifically design or utilize cation and anion components of the molecular compound, neither one of which exhibit significant water solubility. Identifying such non-water-soluble components is not always a straightforward task. It is also necessary to prepare stable solutions that contain both cation and anion, and those solutions may not exhibit long term stability. Parameters that control the preparation of a good film of ionic amphiphiles include controlling the pH of the subphase, the ionic strength of the subphase, the deposition and transfer temperature, deposition solvents, and the transfer rates.

Both non-volatile and volatile devices were fabricated. Procedure A was used to produce an array of volatile switching devices (referred to as Type V devices), while Procedure B produced an array of non-volatile switching devices (referred to as type NV devices).

Procedure A

Figure 7:
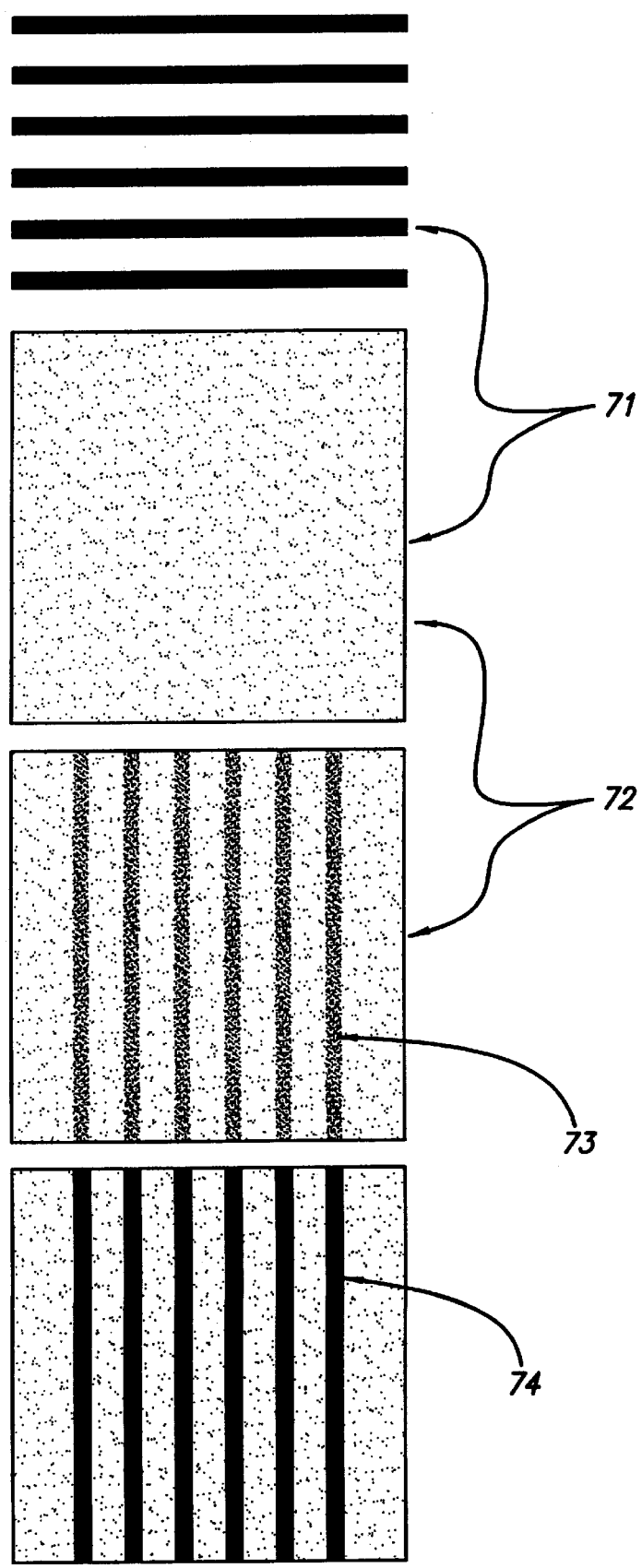
FIG. 7 shows a schematic representation of fabrication steps for volatile and non-volatile devices in accordance with the present invention.

Type V devices were fabricated according to the procedure shown in FIG. 7. In step 1, 5 micrometer wide metal electrodes (71) were deposited onto a silica substrate using standard lithographic and fabrication procedures. The metal electrodes consisted of 0.5 micrometers thick titanium bottom electrode coated with 0.1 nanometers thick aluminum. In step 2, a uniform monolayer of the [2] catenane (FIG. 4) with the counterion (FIG. 6) was deposited as a Langmuir Blodgett film (72).

In order to make a Langmuir monolayer of [2]catenanes with/DMPA counterion amphiphiles, take a solution of 2.4 millimolar of the sodium salt of DMPA in a solution of 3:1 chloroform:methanol. In a separate flask, prepare an 0.8 millimolar solution of the [2]catenane$^{4+}$/4PF$_6$- complex in acetonitrile solvent. Mix 0.5 mls of DMPA solution with 0.26 mls of the [2] catenane stock solution, giving a 6:1 DMPA:[2] catenane concentration. When these two solutions are mixed together, a precipitate will slowly form over time. In order to avoid this precipitate, it is necessary to use this solution immediately after preparation. Using a microsyringe, add approximately 40 microliters dropwise to a Langmuir trough characterized by a surface area of 260 cm$^2$, and filled with 18 MegaOhm (ultrapure) water. Wait for 30 minutes to let the monolayer/subphase equilibrate. Compress the monolayer at a rate of 10 cm$^2$/minute to a surface pressure of 1 milliNewton/meter. Then compress the monolayer at a rate of 5 cm$^2$/minute to a surface pressure of 14 milliNewtons/meter. Then compress the monolayer at a rate of 2 cm$^2$/minute until a surface pressure of 30 milliNewtons/meter is reached. This surface pressure will roughly correspond to an area of 87 Angstroms$^2$ per [2]catenane. Let the monolayer stabilize for 30 minutes. At this point, prepare a Langmuir Blodgett film on the electrode patterned substrate using the vertical transfer method. This means that the patterned substrate is raised through the air/water interface at 1 mm/minute and under constant surface pressure conditions. The measured transfer ratio is approximately 1.1.

In step 3, a top set of Ti electrodes (73) (50 nanometers thick, 10 micrometers wide) was deposited perpendicular to the first set (71). Titanium metal has been previously demonstrated to form a high quality film when evaporated onto organic molecules. In step 4, aluminum electrodes (74) were deposited directly on top of the titanium electrodes (73) that were deposited in step 3. Individual Type V devices were addressed by making electrical contact to one of the top aluminum electrodes (74), and one of the bottom titanium electrodes (71).

The resulting devices exhibited the characteristic hysteresis loop of a volatile memory cell, and can be utilized as either memory elements, or as switching elements.

Figure 8:
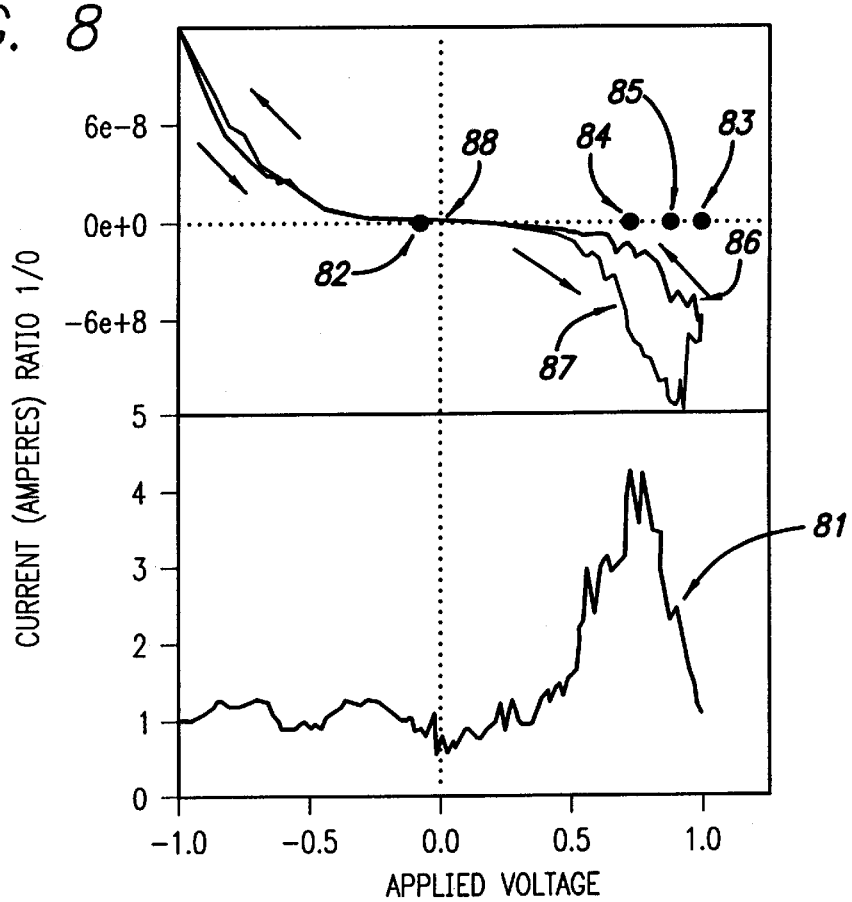
FIG. 8 is a graph depicting the hysteresis loop for a volatile device in accordance with the present invention.

The actual operation of one Type V device is demonstrated in FIG. 8. In this instance, the current/voltage hysteresis loop (86,87) lies to the high voltage side of the 0-voltage, 0-current point (88). This is why the switch is considered to be volatile. If the Type V device is written at some high voltage value (83) (+1 V, for example), the switch is in the 'open', or '0' state. This state may be read at some intermediate voltage (83 to 84) (between +0.65 and +0.85 volts, for example). If the Type V device is written at some low voltage value (82) (0 volts, for example), the device is moved to the 'closed', or '1' state. This may again be read at the same intermediate voltage (83 to 84). The ratio of the reverse (86) and forward (87) hysteresis curves is shown (81), and this ratio reveals the voltage range over which this particular device is useful.

Procedure B

Figure 9:
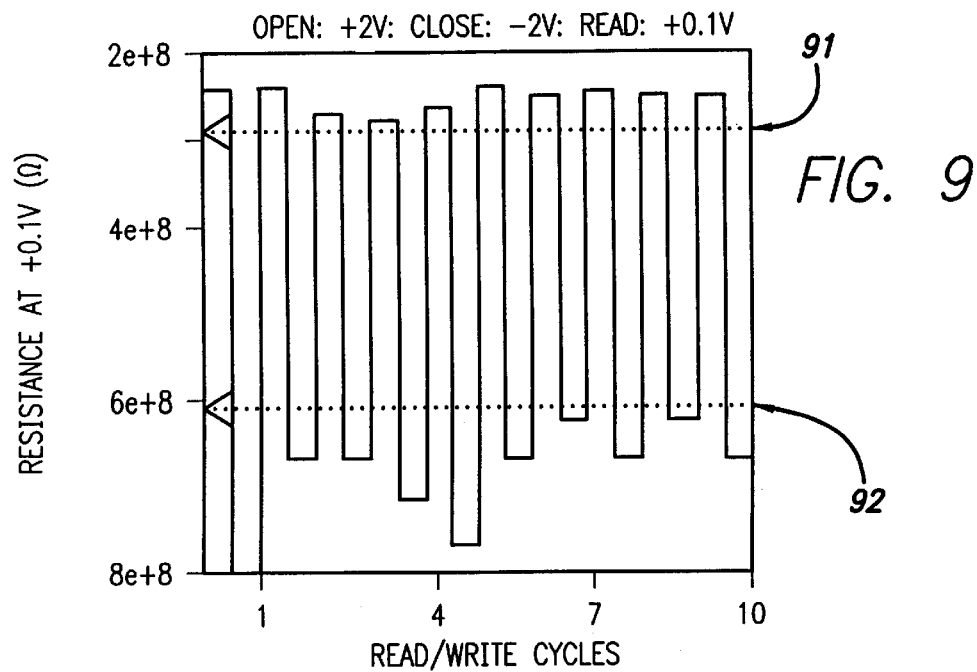
FIG. 9 is a graph showing the cycling of an exemplary non-volatile [2]catenane based molecular switch in accordance with the present invention. The device is placed in the 'open', or '0' state by writing the device at +2V. The device is placed in the 'closed', or '1' state by writing the device at −2V. The device is read at +0.1V. The graph shows the resistance of the device as it is cycled between the two states.

Type NV devices are non-volatile switches, and they were also made according to the fabrication procedure shown in FIG. 7, except that now the first set of electrodes (71) were made from n-doped polycrystalline Silicon. These electrodes were exposed to air to allow the passivation of the polysilicon surface with oxygen to take place, prior to transferring the Langmuir Blodgett molecular monolayer of [2] catenanes (72). FIG. 9 shows, instead of the hysteresis loop, the actual cycling of one of these switches between the open and closed states. The NV device was set into the 'open', or '0' state at +2V, the 'closed' or '1' state at −2 V, and it was read at +0.1 V. Because the bottom electrode (71) was a semiconductor and the top electrode (73,74) was a metal, this device has built-in diode behavior, in addition to the molecular switching characteristics. For this device, the read was 'non-destructive,' meaning that the state of the switch is not altered by the physical act of probing that state.

Other exemplary devices may be made as follows:

The critical components of the [2]catenane (FIG. 4A) that assist in molecular switching are the positively charged bipyridinium units (45) on one ring (42), and the tetrathiafulvalene chemical group (44) on the other ring (41). Other exemplary devices can be made by substituting other suitable chemical groups involved in the [2] catenane. For example, a [2] catenane in which the biphenyl group (43) is, replaced with a phenyl group would also serve as a switchable catenane. In this case, the chemical formula for the [2] catenane cation is $[C_{66}H_{74}N_4O_{10}S_4]^{4+}$. Evidence of the solution-phase switching of such a catenane has been reported. (V. Balzani, A. Credi, G. mattersteig, O. A. Matthews, F. M. Raymo, J. F. Stoddart, M. Venturi, A. J. P. White, and D. J. Williams, "The switching of pseudorotaxanes and catenanes incorporating a tetrathiafulvalene unit by redox and chemical inputs," *Journal of Organic Chemistry* (in press, 1999)). Alternative [2] catenanes include those in which the biphenyl group (43) is replaced by virtually any other chemical group, other than a tetrathiafulvalene unit. Other chemical groups might include such things as ethers or alkyl groups. Also, [2] catenanes in which the ring (42) that contains the bipyridinium units (45) but utilizes biphenyl, alkyl, or a variety of other groups, instead of a phenyl group, to link the bipyridinium units, are suitable for making solid-state switching or reconfigurable memory devices. Any of the above described [2] catenanes in which the counterion (FIG. 6) is replaced by other amphiphilic counterions such as those described above will also work as a solid-state switching or reconfigurable memory device.

The critical electrode components of these molecular switching devices include electrodes the appropriate Fermi levels so that the volatility or non-volatility of the switching device can be controlled. P-doped Silicon, or n- or p-doped polysilicon electrodes would be suitable substitutions for the n-doped polysilicon bottom electrode (59) in the non-volatile device. Various metal electrodes, including platinum, chromium, and aluminum can also be substituted for either the bottom or top electrodes. However, in those cases, it would be necessary to consider the Fermi levels of those electrodes to determine whether or not the molecular switching/memory device would be volatile or nonvolatile.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the above preferred embodiments, but is only limited by the following claims.

What is claimed is:

1. A solid state molecular switching device comprising:
   a first terminal;
   a second terminal; and
   a bistable molecules sandwiched between said first and second terminals wherein said bistable molecule is a [2] catenane.

2. A solid state molecular switching device according to claim 1 wherein said switching device is a volatile molecular switching device.

3. A solid state molecular switching device according to claim 2 which is present in a memory cell, routing circuit, inverter or field programmable device array.

4. A solid state molecular switching device according to claim 3 wherein said memory cell, routing circuit, inverter or field programmable device array exhibits diode behavior.

5. A solid state molecular switching device according to claim 1 wherein said switching device is a non-volatile molecular switching device.

6. A solid state molecular switching device according to claim 5 which is present in a memory cell, routing circuit, inverter or field programmable device array.

7. A solid state molecular switching device according to claim 6 wherein said memory cell, routing circuit, inverter or field programmable device array exhibits diode behavior.

8. A solid state molecular switching device according to claim 1 wherein said [2] catenane is $C_{70}H_{76}F_{24}N_4O_{10}P_4S_4$.

9. A method for making a solid state molecular switching device which comprises a step of forming a monolayer of a [2] catenane molecules which are sandwiched between two terminals, said monolayer formation step comprising the step of mixing a sufficient amount of counter ions with [2] cantenane molecules to provide a film forming mixture which is electrically neutral and which is suitable for use in forming said monolayer of [2] catenane molecules.

10. A method for making a solid state molecular switching device according to claim 9 wherein said [2] catenane is $C_{70}H_{76}F_{24}N_4O_{10}P_4S_4$.

11. A method for making a solid state molecular switching device according to claim 9 wherein said counter ion is selected from the group consisting of amphiphilic sulfate anions, amphiphilic carboxylate and amphiphilic phospholipid anions.

12. A method for making a solid state molecular switching device according to claim 9 wherein said counter ion is selected from the group consisting of amphiphilic sulfate anions, amphiphilic carboxylate and amphiphilic phospholipid anions.

13. A method for making a solid state molecular switching device according to claim 10 wherein said counter ion is $PF_6^-$.

14. A solid state molecular switching device comprising a first terminal, a second terminal and a layer of [2] catenane molecules sandwiched between said first and second terminals wherein said layer of [2] catenane molecules is made according to the method of claim 9.

15. A solid state molecular switching device according to claim 14 wherein said switching device is a volatile molecular switching device.

16. A solid state molecular switching device according to claim 15 which is present in a memory cell, routing circuit, inverter or field programmable device array.

17. A solid state molecular switching device according to claim 14 wherein said switching device is a non-volatile molecular switching device.

18. A solid state molecular switching device according to claim 17 which is present in a memory cell, routing circuit, inverter or field programmable device array.

* * * * *